US012784822B2

(12) United States Patent
Park et al.

(10) Patent No.: US 12,784,822 B2
(45) Date of Patent: Nov. 3, 2026

(54) COMPUTING-IN-MEMORY DEVICE SHARING CHARGES OF BIT LINES TO GENERATE REFERENCE VOLTAGE AND ITS OPERATING METHOD THEREOF

(71) Applicant: KOREA UNIVERSITY RESEARCH AND BUSINESS FOUNDATION, Seoul (KR)

(72) Inventors: Jongsun Park, Seoul (KR); Kyeong-ho Lee, Seoul (KR); Junwoo Park, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 90 days.

(21) Appl. No.: 18/819,404

(22) Filed: Aug. 29, 2024

(65) Prior Publication Data

US 2025/0078918 A1 Mar. 6, 2025

(30) Foreign Application Priority Data

Aug. 29, 2023 (KR) ........................ 10-2023-0113668
Mar. 25, 2024 (KR) ........................ 10-2024-0040528

(51) Int. Cl.
*G11C 11/00* (2006.01)
*G06F 7/544* (2006.01)
(Continued)

(52) U.S. Cl.
CPC .......... *G11C 11/419* (2013.01); *G06F 7/5443* (2013.01); *G11C 11/412* (2013.01)

(58) Field of Classification Search
CPC .... G11C 11/419; G11C 11/412; G06F 7/5443
See application file for complete search history.

(56) References Cited

U.S. PATENT DOCUMENTS

| | | | | |
|---|---|---|---|---|
| 11,423,983 | B2 * | 8/2022 | Lin | G11C 13/004 |
| 12,474,890 | B2 * | 11/2025 | Nam et al. | G11C 7/1006 |
| 2022/0357922 | A1 * | 11/2022 | Lee et al. | G06F 7/5443 |

FOREIGN PATENT DOCUMENTS

| | | |
|---|---|---|
| KR | 10-2020-0012928 A | 2/2020 |
| KR | 10-2023-0038083 A | 3/2023 |

OTHER PUBLICATIONS

Lee et al., "Low-Cost 7T-SRAM Compute-In-Memory Design based on Bit-Line Charge-Sharing based Analog-To-Digital Conversion," IEEE/ACM International Conference on Computer-Aided Design (ICCAD), Oct. 30-Nov. 3, 2022 (8 pages).

(Continued)

*Primary Examiner* — Pho M Luu
(74) *Attorney, Agent, or Firm* — Hauptman Ham, LLP

(57) ABSTRACT

A computing-in-memory device includes a memory cell array including a plurality of local arrays that generates a first output signal and a second output signal by performing a multiply-accumulate (MAC) operation on an input signal applied through a plurality of operation word lines and a stored weight, a reference voltage generator that generates a reference voltage by sharing charges of the first output signal with adjacent global bit lines, and an analog-to-digital converter that compares the reference voltage with the second output signal and converts the second output signal into a digital signal based on a result of the comparison.

9 Claims, 10 Drawing Sheets

10

(51) Int. Cl.
*G11C 11/419* (2006.01)
*G11C 11/412* (2006.01)

(56) References Cited

OTHER PUBLICATIONS

Office Action dated Jan. 7, 2025 for corresponding Korean Patent Application No. 10-2024-0040528, along with an English machine translation (8 pages).

* cited by examiner

FIG. 7

Designated pattern of reference generation (5-bit ADC)

| $REF_{[N]}$ | Phase 0 | Phase 1 | Phase 2 | Phase 3 | Phase 4 | Mux Sel. |
|---|---|---|---|---|---|---|
| 0 | 1/2 | 1/4 | 1/8 | 1/16 | 1/32 | 0000 |
| 1 | | | | | 17/32 | 0001 |
| 2 | | | | 9/16 | 9/32 | 0010 |
| 3 | | | | | 25/32 | 0011 |
| 4 | | | 5/8 | 5/16 | 5/32 | 0100 |
| 5 | | | | | 21/32 | 0101 |
| 6 | | | | 13/16 | 13/32 | 0110 |
| 7 | | | | | 29/32 | 0111 |
| 8 | | 3/4 | 3/8 | 3/16 | 3/32 | 1000 |
| 9 | | | | | 19/32 | 1001 |
| 10 | | | | 11/16 | 11/32 | 1010 |
| 11 | | | | | 27/32 | 1011 |
| 12 | | | 7/8 | 7/16 | 7/32 | 1100 |
| 13 | | | | | 23/32 | 1101 |
| 14 | | | | 15/16 | 15/32 | 1110 |
| 15 | | | | | 31/32 | 1111 |
| $V_{GBL}$ | 1/2 | 3/4 | 5/8 | 11/16 | 21/32 | $V_{GBLB}$: 600mV |
| Mux Sel. | XXXX | 1XXX | 01XX | 101X | 0101 | |
| SR output | XXXX1 | XXX10 | XX101 | X1010 | 10101 | |

COMPUTING-IN-MEMORY DEVICE SHARING CHARGES OF BIT LINES TO GENERATE REFERENCE VOLTAGE AND ITS OPERATING METHOD THEREOF

CROSS-REFERENCE TO RELATED APPLICATIONS

This application claims priority under 35 U.S.C. § 119 to Korean Patent Application No. 10-2023-0113668 filed on Aug. 29, 2023, and Korean Patent Application No. 10-2024-0040528 filed on Mar. 25, 2024, in the Korean Intellectual Property Office, the disclosures of which are incorporated by reference herein in their entireties.

BACKGROUND

Embodiments of the present disclosure described herein relate to a computing-in-memory device that generates a reference voltage by sharing charges of bit lines and a method of operating the same.

Since a memory supporting read/write operations and an operator supporting a data operation are separated in a conventional computer structure, the energy consumption generated by data movement between the memory and the operator is very large compared to the energy consumption used for the operation itself. In particular, a Multiply-Accumulate (MAC) operation, which is a multiply-accumulate operation used in the convolution layer of artificial neural networks, which is mainly used in modern applications, requires a huge amount of data. Therefore, much more energy is consumed in the movement of data required for such an artificial neural network operation than in a general operation. To solve this issue, a memory technology called computing-in-memory (CIM) has developed that reduces data movement between the memory and the operator by adding computing operations in the memory performing only read/write operations.

However, since a large number of registers and capacitors are required to generate a reference voltage corresponding to multiple bits of the existing CIM memory, there is an issue that the area and power consumption of the memory increase.

SUMMARY

Embodiments of the present disclosure provide a computing-in-memory device that generates a reference voltage by sharing charges of bit lines and an operating method thereof.

According to an embodiment of the present disclosure, a computing-in-memory device includes a memory cell array including a plurality of local arrays that generates a first output signal and a second output signal by performing a multiply-accumulate (MAC) operation on an input signal applied through a plurality of operation word lines and a stored weight, a reference voltage generator that generates a reference voltage by sharing charges of the first output signal with adjacent global bit lines, and an analog-to-digital converter that compares the reference voltage with the second output signal and converts the second output signal into a digital signal based on a result of the comparison.

According to an embodiment, the local array may include a local cell including a plurality of first transistors storing the weight and a second transistor computing the input signal and that generates a result of the MAC operation with respect to the input signal using the plurality of first transistors and the second transistor, and a peripheral circuit located below the local cell and that transfers the result of the MAC operation to a global bit line pair.

According to an embodiment, the local cell may generate a least significant bit by multiplying the input signal by the weight so as to transfer to a local bit line bar, and may generate a most significant bit by multiplying an inverted signal of the input signal by the weight so as to transfer to a cell strapping line and a common source line.

According to an embodiment, the peripheral circuit may be connected to the global bit line pair and may be commonly connected to a local bit line pair, the cell strapping line, and the common source line.

According to an embodiment, the peripheral circuit, when the most significant bit and the least significant bit are applied, may electrically connect the local bit line pair, the cell strapping line, and the common source line to convert the most significant bit and the least significant bit into an analog voltage.

According to an embodiment, the reference voltage generator may determine a first global bit line as a master bit line, and may determine a second global bit line adjacent to the first global bit line as a slave bit line.

According to an embodiment, the reference voltage generator may generate the reference voltage having 16 different voltage levels by sharing charges of the master bit line and the slave bit line.

According to an embodiment, the digital signal may be a 5-bit signal with respect to the second output signal.

According to an embodiment of the present disclosure, a method of operating a computing-in-memory device includes generating a first output signal and a second output signal by performing a multiply-accumulate (MAC) operation on an input signal applied through a plurality of operation word lines and a stored weight, generating a reference voltage by sharing charges of the first output signal with adjacent global bit lines, and comparing the reference voltage with the second output signal and converting the second output signal into a digital signal based on a result of the comparison.

According to an embodiment, the generating of the reference voltage may include determining a first global bit line as a master bit line, determining a second global bit line adjacent to the first global bit line as a slave bit line, and generating the reference voltage having 16 different voltage levels by sharing charges of the master bit line and the slave bit line.

According to an embodiment of the present disclosure, the computing-in-memory device that generates a reference voltage by sharing charges of bit lines may omit registers or capacitors by using bit lines to convert an analog signal into a digital signal. Accordingly, the power consumption and the design area of the computing-in-memory device may be minimized.

BRIEF DESCRIPTION OF THE FIGURES

The above and other objects and features of the present disclosure will become apparent by describing in detail embodiments thereof with reference to the accompanying drawings.

FIG. 7 is a table illustrating results according to an analog-to-digital converter of FIG. 6.

DETAILED DESCRIPTION

Hereinafter, embodiments of the present disclosure may be described in detail and clearly to such an extent that an ordinary one in the art easily implements the present disclosure.

Figure 1:
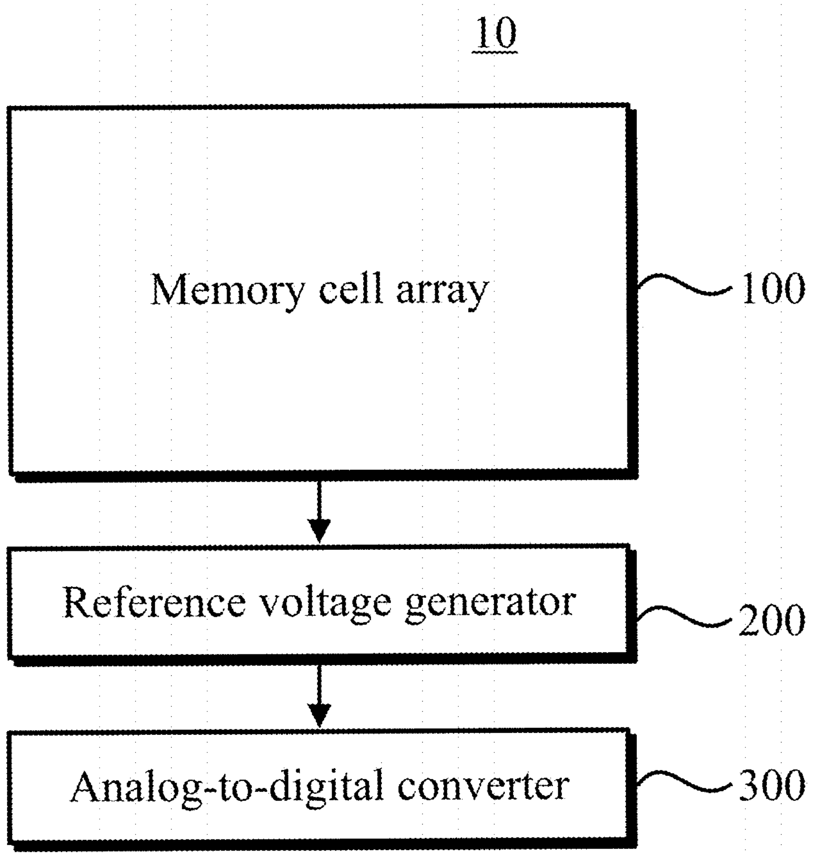
FIG. 1 is a block diagram illustrating a computing-in-memory device, according to an embodiment of the present disclosure.

FIG. 1 is a block diagram illustrating a computing-in-memory device, according to an embodiment of the present disclosure.

A computing-in-memory device 10 may include a memory cell array 100, a reference voltage generator 200, and an analog-to-digital converter 300.

The computing-in-memory device 10 according to an embodiment of the present disclosure may be implemented in a memory device. For example, the computing-in-memory device 10 may be implemented in in-memory computing of various devices such as a laptop computer, a desktop computer, a notebook computer, a tablet computer, a smart phone, a personal digital assistant (PDA), a wearable device, etc.

The memory cell array 100 may perform a multiply-accumulate (MAC) operation on an input signal applied through a plurality of operation word lines $WL_W$ and $WL_{Wb}$ and a stored weight in advance.

In addition, the memory cell array 100 may be configured to output a first output signal and a second output signal according to the MAC operation to the global bit line pair GBL and GBLB, respectively.

In an embodiment, a local array of the memory cell array 100 may include a plurality of local cells. In this case, each of the plurality of local cells may store a weight. The weight may be stored in each local cell based on a word line that is separately connected to the local cell to store the weight rather than the plurality of operation word lines $WL_W$ and $WL_{Wb}$.

In an embodiment, the MAC operation performed by the memory cell array 100 may be performed simultaneously in the plurality of local cells included in the local array, and the memory cell array 100 may output the results of the MAC operation performed in each cell as the first output signal and the second output signal through the global bit line pair GBL and GBLB.

The reference voltage generator 200 may receive the first output signal through the global bit line GBL and may generate the reference voltage with respect to the first output signal through a charge sharing repetition based on a precharge. The reference voltage is generated based on an analog signal of the memory cell array 100, and thus may be a reference voltage for reading the second output signal.

The reference voltage generator 200 may receive the first output signals of adjacent local cells to a master bit line "Master BL" and a slave bit line "Slave BL" and may generate a plurality of reference voltages by precharging or discharging each bit line pair.

For example, when the reference voltage generator 200 is connected to the memory cell array 100 with 32 global bit lines GBL, the reference voltage generator 200 may receive a first output signal pair of adjacent local cells to the master bit line "Master BL" and the slave bit line "Slave BL" and may generate a reference voltage having 16 voltage levels.

The analog-to-digital converter 300 may receive a reference voltage through the global bit line GBL and may receive a second output signal that is obtained by the MAC operation through the global bit line bar GBLB. Accordingly, the analog-to-digital converter 300 may output a digital value, which is a multi-bit signal with respect to the second output signal, by sequentially comparing the reference voltage with the second output signal.

For example, the analog-to-digital converter 300 may output a 5-bit digital value by comparing the reference voltage having 16 voltage levels with the second output signal. A more detailed description will be described in FIG. 5 below.

As described above, the computing-in-memory device 10 according to the embodiment of the present disclosure may reduce the overall power consumption of the computing-in-memory device 10 by using the bit lines to convert an analog signal into a digital signal, and may reduce the design area and cost by omitting registers or capacitors.

Figure 2:
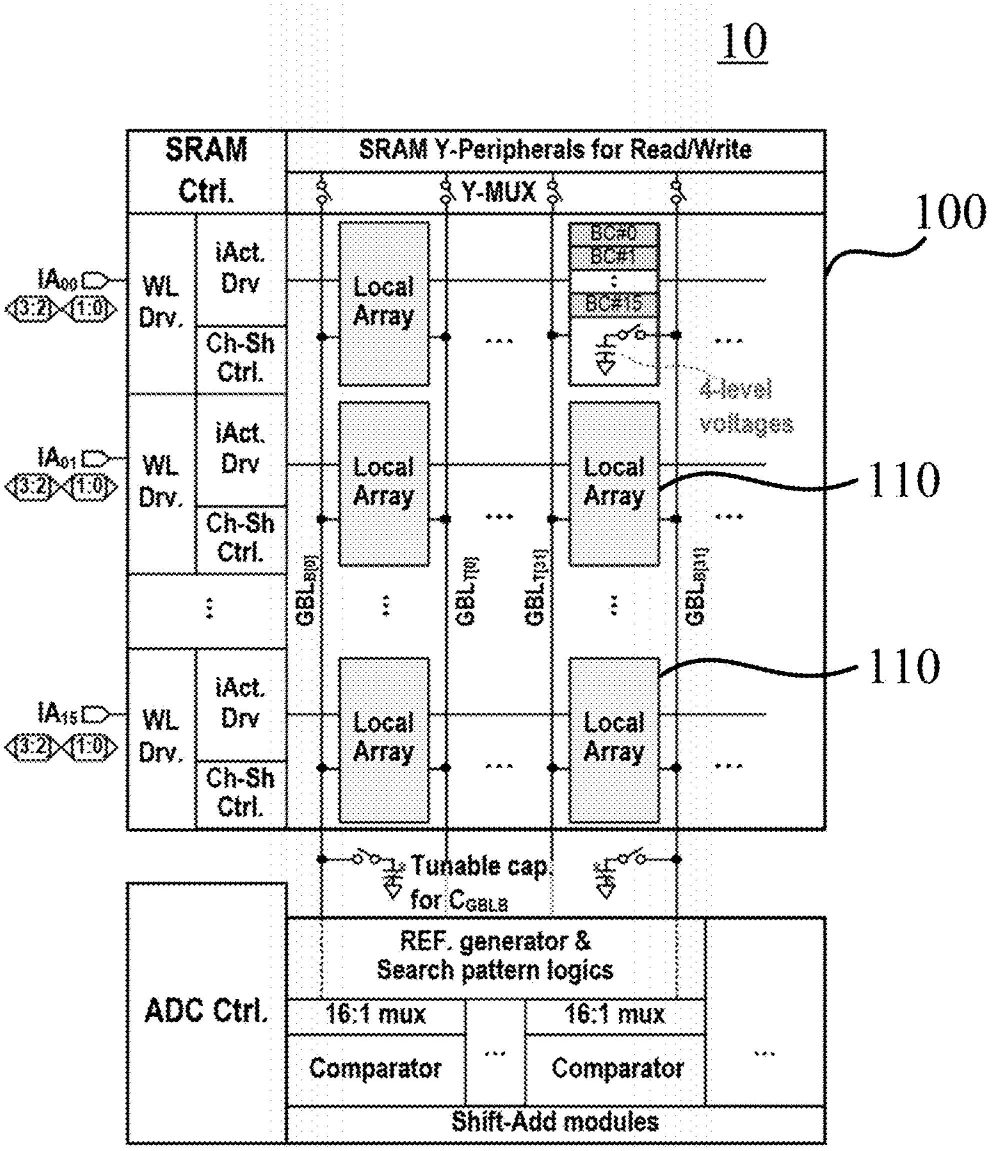
FIG. 2 is a diagram illustrating a memory cell array 100, according to an embodiment of the present disclosure.

FIG. 2 is a diagram illustrating the memory cell array 100, according to an embodiment of the present disclosure.

Referring to FIG. 2, the memory cell array 100 may include a plurality of local arrays 110. The plurality of local arrays 110 arranged in a column direction are commonly connected to the same global bit line GBL among a plurality of bit line pairs, and each of the plurality of local arrays 110 is connected to one of a plurality of different word lines WL disposed in a row direction. In FIG. 2, an example is illustrated in which 0th to 31st global bit lines GBL [0:31] are connected to the plurality of local arrays 110, but the number of local arrays 110 and global bit lines GBL that may be included in the memory cell array 100 is not limited thereto. According to an embodiment, the memory cell array 100 may be an SRAM (Static Random Access Memory) memory cell array, but is not limited thereto.

The local array 110 may include local cells that store weights required for the MAC operation and a local MAC operation unit that performs the MAC operation on an analog voltage. Accordingly, the local array 110 may perform the MAC operation on weights stored in the cell in advance and the analog voltage corresponding to multi-bit input data.

As described above, the memory cell array 100 according to the embodiment of the present disclosure may perform the MAC operation within the memory, thereby increasing energy efficiency, and may reduce the cost and the design complexity of the computing-in-memory by generating a reference voltage obtained by utilizing the column direction structure of the local cells.

Figure 3:
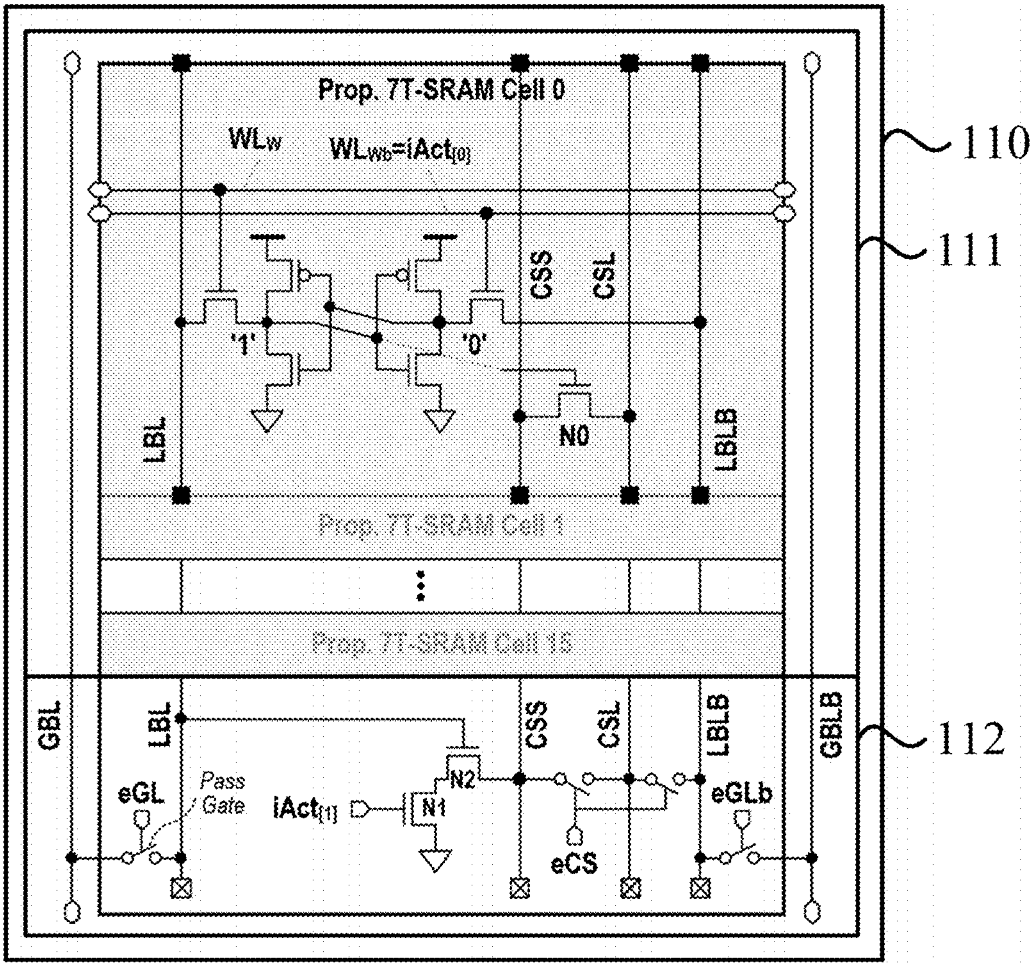
FIG. 3 is a diagram illustrating a configuration of a local array, according to an embodiment of the present disclosure.

FIG. 3 is a diagram illustrating a configuration of a local array, according to an embodiment of the present disclosure.

Referring to FIG. 3, the GBL and GBLB represent the global bit line pair, LBL and LBLB represent the local bit line pair, CSS represents a cell strapping line, and CSL represents a common source line.

In an embodiment, the local array 110 may include a local cell 111 and a peripheral circuit 112. The local cell 111 may have a P-7T SRAM cell structure. In detail, the local cell 111 may have the P-7T SRAM cell structure that is implemented with six transistors for storing weights and one transistor for computing an input signal.

The P-7T SRAM cell structure may be a structure in which one NMOS transistor "N0" is additionally connected to a conventional 6T SRAM structure capable of only read/write operations, as illustrated. For example, in the P-7T SRAM cell, a source electrode and a drain electrode of the NMOS transistor "N0" may be connected to the cell strapping line CSS and the common source line CSL, respectively.

The peripheral circuit 112 is located below the plurality of local cells 111 and may transfer the MAC operation results of the local cells 111 to the global bit line pair GBL and GBLB. In an embodiment, the peripheral circuit 112 may be connected to the global bit line pair GBL and GBLB through two switches SW1 and SW2 and may be commonly connected to the local bit line pair LBL and LBLB, the cell strapping line CSS, and the common source line CSL.

In an embodiment, the peripheral circuit 112 may operate as a digital-to-analog converter DAC. For example, the peripheral circuit 112 may convert the MAC operation results of the local cells 111 into an analog voltage so as to transfer to the global bit line pair GBL and GBLB.

Figure 4A:
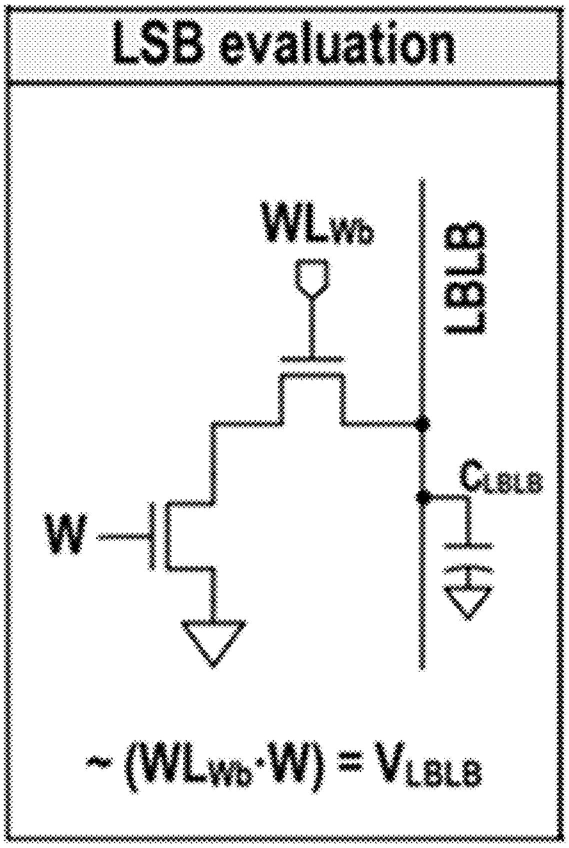
FIGS. 4A and 4B are circuit diagrams of a local cell, according to an embodiment of the present disclosure.
Figure 4B:
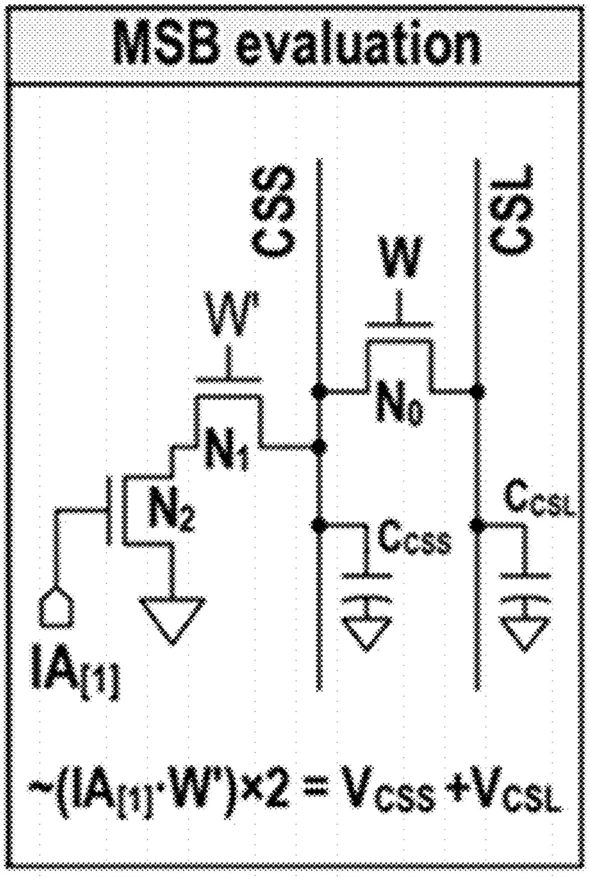

FIGS. 4A and 4B are circuit diagrams of a local cell, according to an embodiment of the present disclosure. In detail, FIG. 4A is a circuit diagram illustrating a part of a local cell that generates a least significant bit (LSB), and FIG. 4B is a circuit diagram illustrating a part of a local cell that generates a most significant bit (MSB).

Referring to FIG. 4A, the least significant bit of the local cell 111 may be generated by performing a multiplication operation on an input signal applied through an operation word line bar $WL_{Wb}$ connected to the local cell 111 and a weight "W" of the local cell 111. Accordingly, the generated least significant bit of the local cell 111 may be transferred to the local bit line bar LBLB.

Referring to FIG. 4B, the most significant bit of the local cell 111 may be generated by performing a multiplication operation on an inverted signal of an input signal and the weight "W" of the local cell 111. As an example, the local cell 111 may be generated by performing a multiplication operation through three transistors NO, N1, and N3. Accordingly, the generated most significant bit of the local cell 111 may be transferred to the cell strapping line CSS and the common source line CSL.

For example, the local cell 111 may precharge all three bit lines LBLB, CSS, and CSL with a power supply voltage VDD before starting the operation. In this case, when the least significant bit is "1" and the weight is "1", a discharge path is formed through two transistors inside the local cell 111, so that the local bit line bar LBLB may be discharged to a ground voltage VSS. In addition, when the most significant bit is "1" and the weight is "1", all three transistors NO, N1, and N2 are turned on, so that both the cell strapping line CSS and the common source line CSL may be discharged to the ground voltage VSS. In contrast, when the most significant bit is "1" and the weight is "0", one transistor N2 is turned on and the remaining two transistors NO and N1 are turned off, so that the discharge path of the cell strapping line CSS and the common source line CSL is not formed, and thus the power supply voltage VDD may be maintained.

In an embodiment, the entire result of the operation of the local cells 111 may be accumulated and transferred to the peripheral circuit 112 through the local bit line pair LBL and LBLB, the cell strapping line CSS, and the common source line CSL.

Figure 5A:
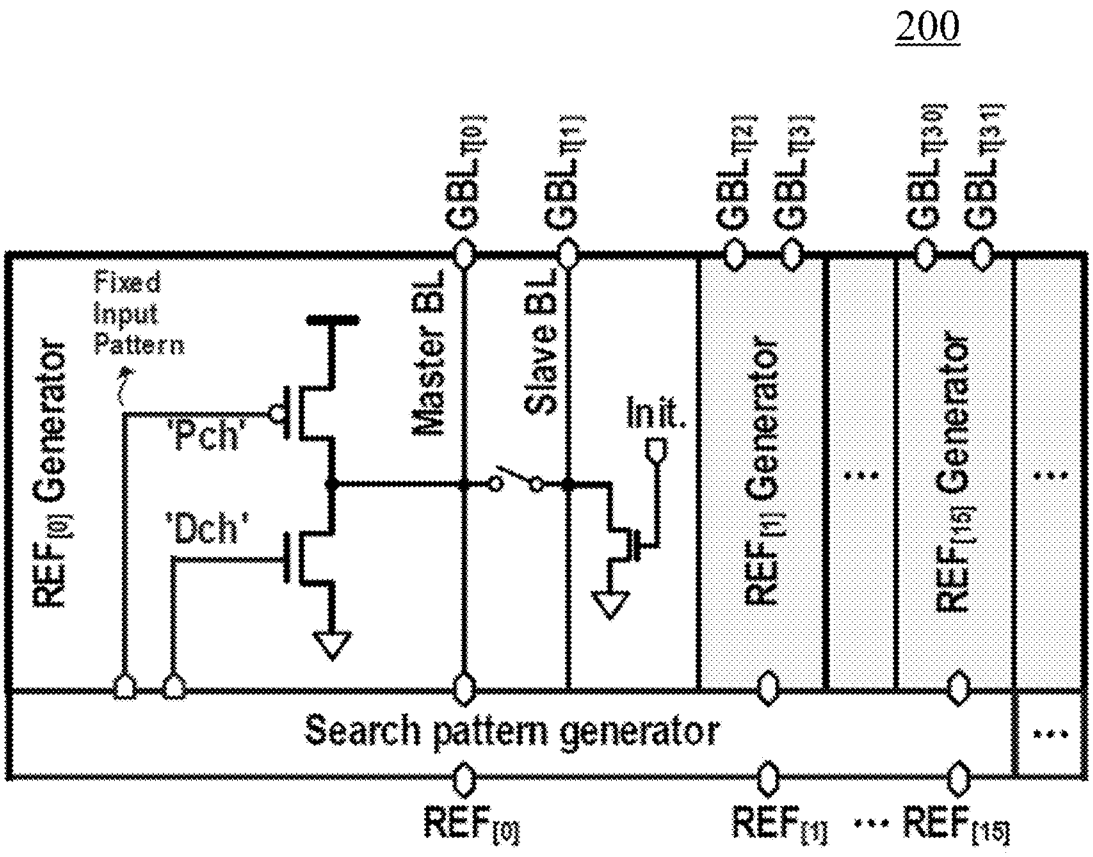
FIGS. 5A and 5B are diagrams for describing an operation of a reference voltage generator, according to an embodiment of the present disclosure.
Figure 5B:
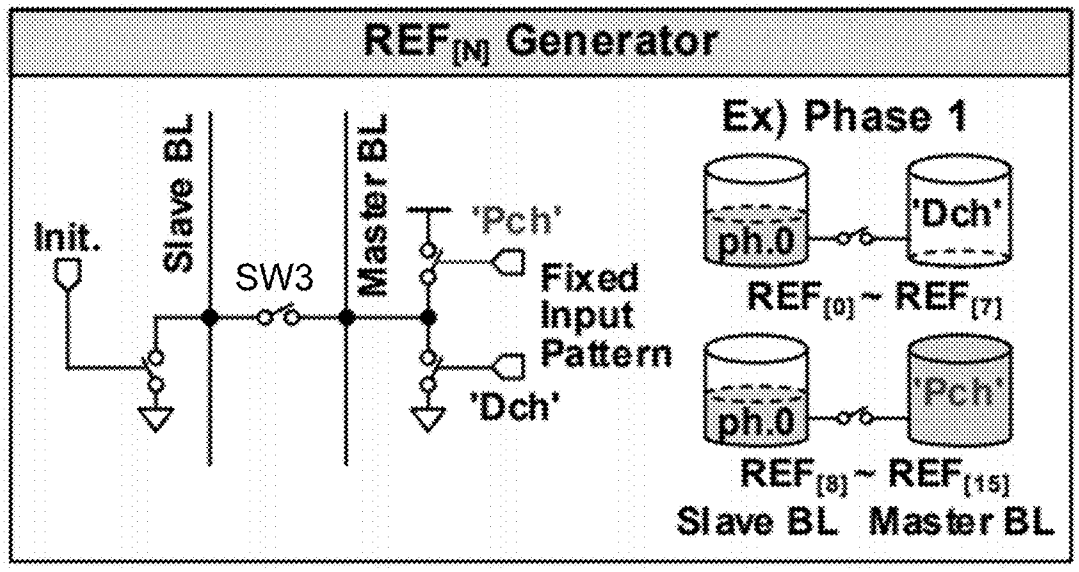

FIGS. 5A and 5B are diagrams for describing an operation of a reference voltage generator, according to an embodiment of the present disclosure. In detail, FIG. 5A is a diagram briefly illustrating a circuit diagram of the reference voltage generator 200, and FIG. 5B is a diagram for describing a method of generating the reference voltage.

Referring to FIG. 5A, the reference voltage generator 200 may receive voltages of two global bit lines (e.g., GLB [0], GLB [1]) of adjacent cells among 32 global bit lines GBL [0:31] as the master bit line "Master BL" and the slave bit line "Slave BL".

The reference voltage generator 200 may perform charge sharing by turning on or off a switch connecting the master bit line "Master BL" and the slave bit line "Slave BL" based on a plurality of control signals Pch and Dch and an initialization signal "Init".

For example, the reference voltage generator 200 may generate a plurality of reference voltages REF [0:15] by repeatedly performing the operations of precharging the master bit line "Master BL" and discharging the slave bit line "Slave BL".

Referring to FIG. 5B, the reference voltage generator 200 may generate the plurality of reference voltages by repeatedly performing charge sharing of the master bit line "Master BL" and the slave bit line "Slave BL".

In an embodiment, the reference voltage generator 200 may connect the master bit line "Master BL" to the slave bit line "Slave BL" to share the charges of the 16 precharged master bit lines "Master BL" and the 16 discharged slave bit lines "Slave BL". In this case, since only half of the global bit lines among the entire global bit lines are precharged with the power supply voltage VDD, ½ of the power supply voltage VDD is generated by the law of conservation of charge.

Thereafter, the reference voltage generator 200 may again connect the master bit line "Master BL" and the slave bit line "Slave BL" to induce charges in the eight discharged master bit lines "Master BL" and the eight precharged slave bit lines "Slave BL". In detail, by connecting the eight slave bit lines "Slave BL" precharged with ½ of the power supply voltage VDD and the eight discharged master bit lines "Master BL", ¼ of the power supply voltage VDD may be formed.

As described above, the reference voltage generator 200 may generate the plurality of reference voltages REF [0:15] having 16 voltage levels based on an operation of discharging or precharging the global bit line pair and reusing charges precharged on one bit line.

Figure 6:
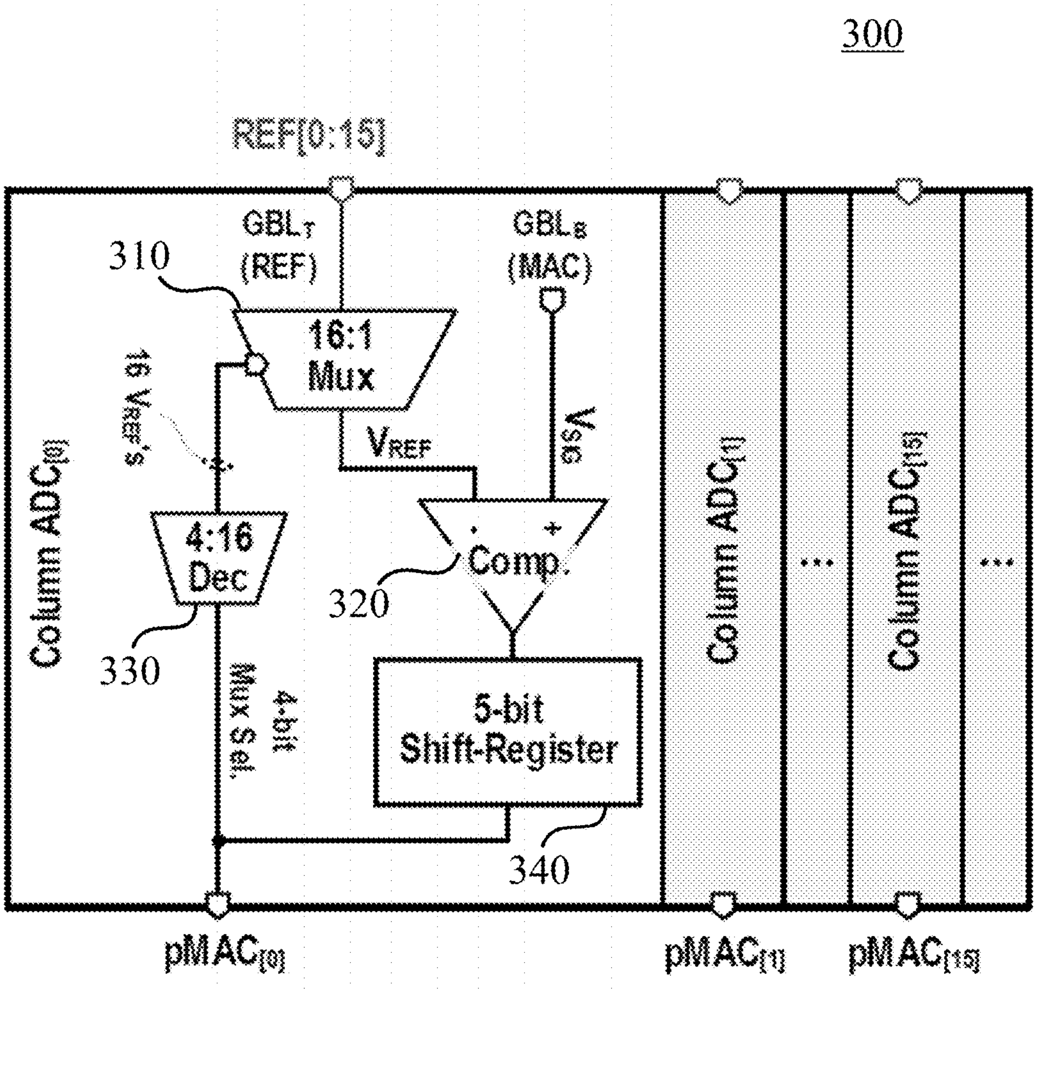
FIG. 6 is a circuit diagram of an analog-to-digital converter, according to an embodiment of the present disclosure.

FIG. 6 is a circuit diagram of an analog-to-digital converter, according to an embodiment of the present disclosure.

Referring to FIG. 6, the analog-to-digital converter 300 may receive the reference voltage REF [0:15] from the reference voltage generator 200 and may receive a MAC operation result value, which is a second output signal, through the global bit line bar GBLB. The analog-to-digital converter 300 may compare the received reference voltage REF [0:15] with the second output signal to output a digital value, which is a multi-bit signal. To this end, the analog-to-digital converter 300 may include a multiplexer 310, a comparator 320, a decoder 330, and a shift register 340.

In an embodiment, the multiplexer 310 may receive the reference voltage REF [0:15] generated by the reference voltage generator 200 and may output one reference voltage VREF. To this end, the multiplexer 310 may be a 16:1 multiplexer.

The comparator 320 may receive the reference voltage VREF to a first input terminal, may receive the MAC operation value to a second input terminal, and may determine one of the 4-bit signals by comparing voltage levels of the first input terminal and the second input terminal.

The decoder 330 may control to change the reference voltage VREF output from the multiplexer 310 according to the comparison result of the comparator 320.

The shift register 340 may perform a shift operation on the 4-bit signal determined through the repeated operation of the reference voltage generator 200 to output a 5-bit digital value.

FIG. 7 is a table illustrating results according to an analog-to-digital converter of FIG. 6.

Referring to FIG. 7, the analog-to-digital converter 300 may output a 4-bit digital value by comparing the MAC operation value and 15 reference voltages REF [0:15] according to each step.

For example, when the MAC operation value is 600 mV and the power supply voltage VDD is 900 mV, in step "0", the analog-to-digital converter 300 may determine a first bit among 4 bits by comparing magnitudes of 600 mV and 450 mV, which is ½ of the power supply voltage VDD. In addition, in step "1", the analog-to-digital converter 300 may determine a second bit among the 4 bits by comparing 600 mV with ¼ and ¾ of the power supply voltage VDD. In detail, the analog-to-digital converter 300 may generate 16 different 4-bit digital values corresponding to the 16 reference voltages REF [0:15] through a total of 5 comparison steps. In addition, the analog-to-digital converter 300 may perform a shift operation to output a 5-bit digital value.

For example, when the 4-bit digital value is "0101", the MAC operation value may be compared with ½ of the power supply voltage VDD, ¾ of the power supply voltage VDD, ⅝ of the power supply voltage VDD, $\frac{11}{16}$ of the power supply voltage VDD, and $\frac{21}{32}$ of the power supply voltage VDD. It may be confirmed that this is consistent with the result of FIG. 7.

Figure 8:
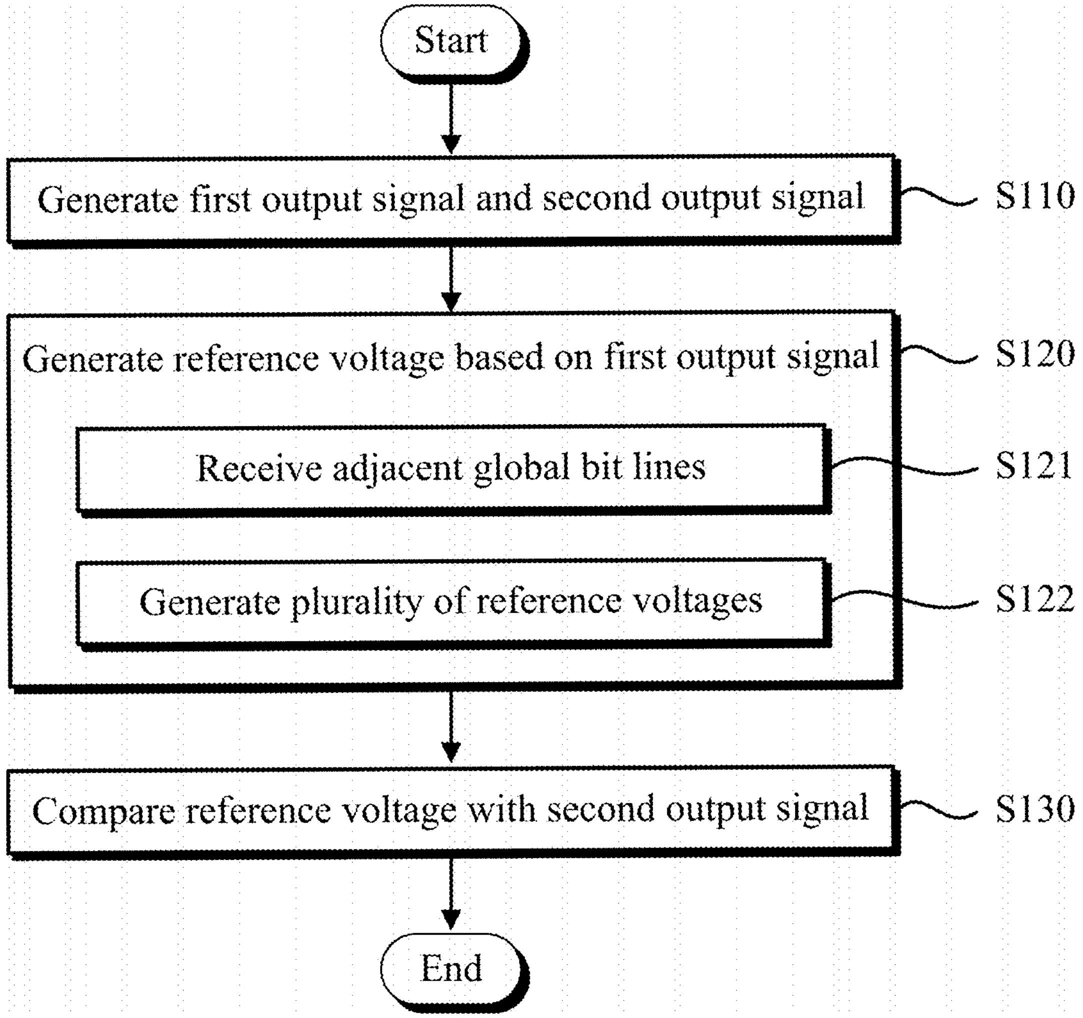
FIG. 8 is a flowchart illustrating an operation of a computing-in-memory device, according to an embodiment of the present disclosure.

FIG. 8 is a flowchart illustrating an operation of a computing-in-memory device, according to an embodiment of the present disclosure.

Referring to FIG. 8, in operation S110, the first output signal and the second output signal may be generated through the MAC operation of input signals applied through the plurality of operation word lines and stored weights. For example, the memory cell array 100 may generate the first output signal and the second output signal by the MAC operation of input signals applied through the plurality of operation word lines and stored weights.

In operation S120, the reference voltage may be generated by repeatedly sharing charges of the first output signal. For example, the reference voltage generator 200 may repeatedly share charges of the first output signal to generate the reference voltage.

Thereafter, an operation of generating the reference voltage may be performed. The operation may be performed through detailed operations as follows, and each detailed operation may be performed simultaneously.

First, in operation S121, the reference voltage generator 200 may receive each of two adjacent global bit lines GBL as the master bit line "Master BL" and the slave bit line "Slave BL".

In operation S122, the reference voltage generator 200 may share the charges of the master bit line "Master BL" and the slave bit line "Slave BL" to generate the reference voltage having 16 different voltage levels.

In operation S130, a digital signal may be generated based on the result of comparing the reference voltage with the second output signal. For example, the analog-to-digital converter 300 may compare the reference voltage and the second output signal and may convert the second output signal into a digital signal based on a result of the comparison.

According to an embodiment of the present disclosure, the computing-in-memory device that generates a reference voltage by sharing charges of bit lines may omit registers or capacitors by using bit lines to convert an analog signal into a digital signal. Accordingly, the power consumption and the design area of the computing-in-memory device may be minimized.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A computing-in-memory device comprising:

a memory cell array including a plurality of local arrays configured to generate a first output signal and a second output signal by performing a multiply-accumulate (MAC) operation on an input signal applied through a plurality of operation word lines and a stored weight;

a reference voltage generator configured to generate a reference voltage by sharing charges of the first output signal with adjacent global bit lines; and an analog-to-digital converter configured to compare the reference voltage with the second output signal and to convert the second output signal into a digital signal based on a result of the comparison, wherein the reference voltage generator is configured to:

determine a first global bit line as a master bit line;

determine a second global bit line adjacent to the first global bit line as a slave bit line; and generate the reference voltage having a plurality of different voltage levels by sharing charges of the master bit line and the slave bit line.

2. The computing-in-memory device of claim 1, wherein the local array includes:

a local cell including a plurality of first transistors storing the weight and a second transistor computing the input signal and configured to generate a result of the MAC operation with respect to the input signal using the plurality of first transistors and the second transistor; and a peripheral circuit located below the local cell and configured to transfer the result of the MAC operation to a global bit line pair.

3. The computing-in-memory device of claim 2, wherein the local cell generates:

a least significant bit by multiplying the input signal by the weight so as to transfer to a local bit line bar, and a most significant bit by multiplying an inverted signal of the input signal by the weight so as to transfer to a cell strapping line and a common source line.

4. The computing-in-memory device of claim 3, wherein the peripheral circuit is connected to the global bit line pair and is commonly connected to a local bit line pair, the cell strapping line, and the common source line.

5. The computing-in-memory device of claim 4, wherein the peripheral circuit, when the most significant bit and the least significant bit are applied, electrically connects the local bit line pair, the cell strapping line, and the common source line to convert the most significant bit and the least significant bit into an analog voltage.

6. The computing-in-memory device of claim 1, wherein the reference voltage have 16 different voltage levels.

7. The computing-in-memory device of claim 1, wherein the digital signal is a 5-bit signal with respect to the second output signal.

8. A method of operating a computing-in-memory device, the method comprising:

generating a first output signal and a second output signal by performing a multiply-accumulate (MAC) operation on an input signal applied through a plurality of operation word lines and a stored weight;

generating a reference voltage by sharing charges of the first output signal with adjacent global bit lines; and comparing the reference voltage with the second output signal and converting the second output signal into a digital signal based on a result of the comparison, wherein the generating of the reference voltage includes determining a first global bit line as a master bit line, determining a second global bit line adjacent to the first global bit line as a slave bit line, and generating the reference voltage having a plurality of different voltage levels by sharing charges of the master bit line and the slave bit line.

9. The method of claim 8, wherein the reference voltage have 16 different voltage levels.

* * * * *